(12) United States Patent
Huang

(10) Patent No.: US 6,285,252 B1
(45) Date of Patent: Sep. 4, 2001

(54) APPARATUS AND METHOD FOR BROADBAND FEEDFORWARD PREDISTORTION

(75) Inventor: Wei Huang, Campbell, CA (US)

(73) Assignee: Harmonic Inc., Sunnyvale, CA (US)

( * ) Notice: Subject to any disclaimer, the term of this patent is extended or adjusted under 35 U.S.C. 154(b) by 0 days.

(21) Appl. No.: 09/409,939

(22) Filed: Sep. 30, 1999

(51) Int. Cl.[7] .................................................. H03F 1/26
(52) U.S. Cl. ............................................. 330/149; 330/151
(58) Field of Search ............................. 330/124 R, 149, 330/151

(56) References Cited

U.S. PATENT DOCUMENTS

| | | |
|---|---|---|
| 3,541,467 | 11/1970 | Seidel . |
| 3,755,754 | 8/1973 | Putz . |
| 4,068,186 | 1/1978 | Sato et al. . |
| 4,130,807 | 12/1978 | Hall et al. . |
| 4,157,508 | 6/1979 | Hecken . |
| 4,987,378 * | 1/1991 | Eggleston et al. ................... 330/149 |
| 4,992,754 | 2/1991 | Blauvelt et al. . |
| 5,051,704 * | 9/1991 | Chapman et al. .................... 330/149 |
| 5,148,117 * | 9/1992 | Talwar ................................. 330/151 |
| 5,258,722 | 11/1993 | Jeffers ................................. 330/149 |
| 5,424,680 | 1/1995 | Nazarathy et al. . |
| 5,963,091 * | 10/1999 | Chen et al. .......................... 330/149 |

OTHER PUBLICATIONS

Meyer et al., "A Wide–Band Feedforward Amplifier", IEEE Journal of Solid State Circuits, vol. SC–9, No. 6, Dec. 1974, pp. 422–428.

\* cited by examiner

*Primary Examiner*—Robert Pascal
*Assistant Examiner*—Khanh Van Nguyen
(74) *Attorney, Agent, or Firm*—Skjerven, Morrill, MacPherson LLP; Norman R. Klivans

(57) ABSTRACT

An amplifying circuit and associated method that outputs a distortion-free signal. The circuit includes an output amplifier driven by two intermediate amplifiers having differing gain factors. The intermediate amplifiers are coupled via an attenuator, a phase shifter, a signal splitter, and signal combiner and produces a predistortion signal that cancels the distortion signal generated from the output amplifier. Another similar amplifying circuit includes an additional combiner and splitter loop, and independently cancels the distortion signal generated by the first intermediate amplifier and the distortion signal generated by the output amplifier.

19 Claims, 7 Drawing Sheets

APPARATUS AND METHOD FOR BROADBAND FEEDFORWARD PREDISTORTION

BACKGROUND

1. Field of the Invention

The present invention relates to a circuit for improving the distortion performance of amplifiers, and more particularly, to a linearization circuit to improve the distortion performance of broadband hybrid RF amplifiers.

2. Description of Related Art

In transferring and distributing signals, most cable television (CATV) networks employ hybrid fiber/coax (HFC) networks. A typical HFC network includes optical transmitter and nodes, and distribution amplifiers to provide optical and electrical paths for the signals, respectively. (An optical node converts between the optical and RF domains.) Effective transfer of the signals along the optical and electrical paths requires output stage signal amplification at the optical transmitter and nodes, and the distribution amplifiers. For this amplification, hybrid RF amplifiers, which typically employ push-pull and power-doubling techniques to improve their distortion performance, are commonly used. Such hybrid RF amplifiers are commercially available from vendors such as Philips and Motorola.

When the coaxial cable portion of an HFC network is passive, that is, there is no distribution amplifier in the network, the distortion from the node output stage amplifier may dominate the total system distortion performance. At such a passive coaxial cable portion, it is desirable to drive the output stage amplifier in the node at maximum power level in order to transmit the signal further. However, higher output power can produce worse distortion performance. Therefore, the optical nodes need an enhanced output stage amplifier to improve the distortion performance at high output power.

There are several known linearization techniques that improve distortion performance of output stage amplifiers. Among them are predistortion and feedforward circuits which are schematically shown in FIGS. 1A and 1B, respectively. Even though both techniques can improve the distortion performance, they have their own limitations.

Referring to FIG. 1A, the feedforward circuit includes an error amplifier 20 to cancel the distortion produced by an output amplifier 10. A first directional coupler 1 splits an input signal onto two paths 12 and 14. On path 12, output amplifier 10 amplifies the signal, and then a second directional coupler 2 splits the amplified signal onto paths 12 and 16. On path 16, an attenuator 3 attenuates the signal, and a phase-shifter 4 phase-shifts the signal by 180°. At a third directional coupler 7, the signal from path 16 and the signal from path 14 through a first delay line 5 combine together. As a result, fundamental portions of the signals from paths 14 and 16 cancel each other, and distortion portions of the signals are coupled at the output of third directional coupler 7. Then, error amplifier 20 amplifies the combined signal which is a distortion signal.

The signal from second directional coupler 2 on path 12 passes through a second delay line 6, and is combined with the amplified signal from error amplifier 20 at a third directional coupler 30. When the output signals combine together at a combiner 30, the distortions in both output are equal in magnitude but opposite in phase, so that the distortions cancel each other. This feedforward technique is known for its high distortion cancellation capability. For example, this feedforward technique can cancel all orders of distortions whereas other linearization techniques only cancel one type of distortion. Thus, the feedforward technique is widely used in broadband applications where reactive components have different effects at different frequencies. However, the feedforward technique has several shortcomings. For example, multiple output amplifiers cannot be coupled to a single feedforward circuit, and there can be signal loss at the output stage. Driving the output amplifier at a higher level to overcome the loss at the output stage may introduce more distortions.

The predistortion circuit shown in FIG. 1B does not introduce any loss at the output stage of output amplifier 10. This circuit employs a distortion generator 40 to produce predistortion from a signal that was split from an input signal through a first directional coupler 22, and provides the predistortion into the input stage of error amplifier 20. At a second directional coupler 24, the other signal that was split from an input signal through a first directional coupler 22 passes through a delay line 25 combines with the signal from error amplifier 20. Then, the combined signal is inputted into output amplifier 10.

The predistortion from distortion generator 40 through error amplifier 20 cancels the distortion from amplifier 10 at the output stage of output amplifier 10. Typically, distortion generator 40 does not have similar distortion characteristics as does amplifier 10, limiting the circuit's cancellation capability.

Diode-based distortion generators, which are widely used for predistortion, have disadvantages when employed in hybrid RF amplifier linearization. First, different orders of distortions may require separate, different distortion generators. That is, separate distortion generators are required to cancel second and third order distortions. This increases cost and circuit complexity. Second, when the hybrid RF amplifiers are driven at high output power, higher (fourth and fifth) order distortions become more pronounced, and overlap on lower order distortion frequencies. Such diode distortion generators cannot effectively cancel the high order distortions.

U.S. Pat. No. 5,258,722, incorporated herein by reference in its entirety, discloses a distortion cancellation circuit including a distortion generating circuit 50, as shown in present FIG. 2. Distortion generator 50 includes a first intermediate amplifier 36, which is ideally identical to each of four output amplifiers 60-1 to 60-4, and a second intermediate amplifier 42. In distortion generator 50, a first splitter 53 splits an input signal onto two paths 32 and 34. The signal on path 32 passes through amplifier 36, a first attenuator 54, and a phase-shifter 57, and the signal on path 34 passes through amplifier 42 and a second attenuator 55. The signals on both paths 32 and 34 combine together at a combiner 56, and the combined signal is inputted into output amplifiers 60-1 to 60-4 through a second splitter 58.

Amplifiers 36 and 60-1 to 60-4 are intended to be driven at the same output power. Theoretically, distortion generating circuit 50 may generate a predistortion that can cancel the distortion generated from output amplifiers 60-1 to 60-4. However, distortion generating circuit 50 may have several shortcomings in practice.

For effective distortion cancellation, output amplifiers 60-1 to 60-4 must be of high gain (30 dB or more) in order to have amplifier 42 driven at far lower power level than are output amplifiers 60-1 to 60-4, so as to compensate for the excessive signal loss in distortion generating circuit 50. Otherwise, amplifier 42 must be driven at much higher power level. The distortion generated from amplifier 42 will become dominant, and the magnitude of the predistortion generated at combining point 56 will not be proper to cancel the distortion generated from output amplifiers 60-1 to 60-4.

Commercially available hybrid RF amplifiers used for forward transmission typically have gain of 18 to 21 dB. If such amplifiers are used for amplifier 36, amplifier 42 will be driven at only a few dB below the output power level of output amplifiers 60-1 to 60-4. In addition, higher gain amplifiers are very difficult to make, and not commercially available.

Another shortcoming is that the fundamental signals from paths 32 and 34 must be subtracted from each other at combining point 56 to obtain the out-of-phase distortion component. The fundamental signal power difference at combining point 56 is 6 dB. When the signal power difference is small as in this case, a slight imbalance in phase and magnitude of signals will degrade frequency response flatness which may affect the optical node frequency response flatness requirement. In addition, the poor flatness will cause the distortion generated by output amplifiers 60-1 to 60-4 to be less similar to the distortion generated by amplifier 36, and in turn will result in incomplete distortion cancellation.

SUMMARY

The present invention is directed to an amplifying circuit to improve distortion performance of broadband RF (radio frequency) amplifiers. A distortion generating amplifier and an error amplifier produce predistortions that cancel the distortions of the output amplifier. That is, the invention is directed to a distortion cancellation circuit which includes both feedforward and predistortion circuits.

An embodiment of the present invention is an amplifying circuit, which includes an output amplifier, two intermediate amplifiers, two signal splitters, two signal attenuators, two combiners, and a phase-shifter. The first splitter splits an input signal onto a first path and a second path, and the first intermediate amplifier amplifies the signal on the first path and produces a distortion signal. The second splitter splits the amplified signal and the distortion signal from the first intermediate amplifier onto a third path and a fourth path.

Then, the first attenuator and phase-shifter respectively attenuates and phase-shifts the signal and the distortion signal by 180 degrees. The first combiner combines the signal and the distortion signal on the third path, and the signal on the second path, so that the signal on the third path and the signal on the second path cancel each other, and couples the resulting distortion signal to a fifth path. On the fifth path, the second intermediate amplifier amplifies the distortion signal from the first combiner.

The second combiner combines the signal and the distortion signal on the fourth path and the distortion signal on the fifth path. At the second combiner, the distortion signal on the fifth path has a magnitude that is twice that of the distortion signal on the fourth path, and a sign opposite to that of the distortion signal on the fourth path. Then, the second attenuator attenuates the signal and the distortion signal from the second combiner, and an output amplifier amplifies the signal and the distortion signal from the second attenuator. In the output amplifier, the distortion signal amplified by the output amplifier cancels the distortion signal generated by the output amplifier.

The circuit in one embodiment further includes multiple output amplifiers and a distributor for distributing the signal and the distortion signal from the second attenuator to the output amplifiers. In one embodiment, the first intermediate amplifier and the output amplifier are driven at the same amplification level. The signal gain from the input terminal of the first intermediate amplifier to the input terminal of the output amplifier is zero.

Another amplifying circuit according to the present invention includes an additional combiner and splitter in addition to the elements of the abovedescribed circuit. In this circuit, the distortion signal from the second intermediate amplifier is split into two paths. The distortion signal on one path is used to cancel the distortion signal generated by the first intermediate amplifier, and the distortion signal on the second path is used to cancel the distortion signal generated by the output amplifier.

BRIEF DESCRIPTIONS OF THE DRAWING

Use of the same reference symbols indicates similar or identical items.

DETAILED DESCRIPTION

The present invention is directed to a linearization circuit to improve the distortion performance of broadband RF amplifiers used, e.g., in the forward direction (downstream) of a CATV network. In accordance with the invention, an embodiment of the linearization circuit, upstream of an output amplifier, employs a distortion generating amplifier and an error amplifier to produce distortions that cancel the distortions of the output amplifier. By using a feedforward circuit as a predistorter, the linearization circuit achieves effective distortion cancellation and minimum signal loss at output stage.

Figure 3:
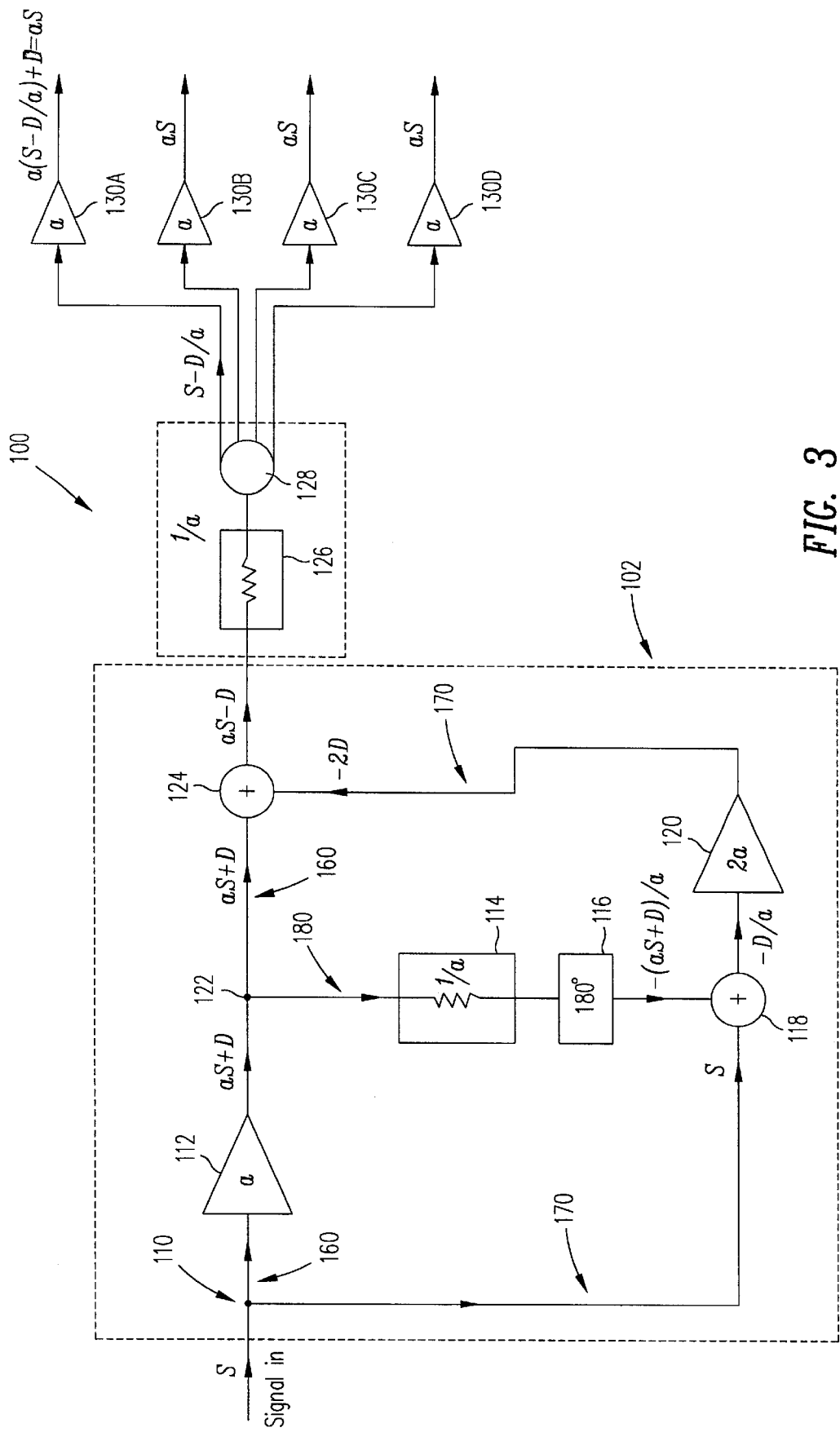
FIG. 3 is a block diagram of an amplification circuit including a distortion cancellation circuit in accordance with the present invention.

FIG. 3 illustrates an amplification circuit 100 including a distortion cancellation circuit, which is a feedforward predistortion circuit, in accordance with the present invention. The magnitudes of signals and distortions are presented in voltages: 'S' denotes signal voltage, and 'D' denotes distortion voltage Referring to FIG. 3, an input signal S from a signal source (not shown) is applied to a terminal 110 where input signal S splits into a first path 160 and a second path 170. Connected in first path 160 is a distortion generating amplifier 112, which amplifies input signal S and outputs signal aS+D. Then, signal aS+D at node 122 splits into first path 160 and a third path 180. Connected in third path 180 are a first attenuator 114 and a phase shifter 116. On third path 180, signal aS+D is thereby attenuated by a factor of 1/a and phase-shifted by 180 degrees to produce signal −(aS+D)/a. Then, signal −(aS+D)/a combines with signal S on second path 170 at a first summing point 118 (preferably without any signal loss), canceling fundamental signal portion (−S) and resulting in signal −D/a. That is, only distortion portion (−D/a) of signal −(aS+D)/a remains.

Then, an error amplifier 120 on second path 170, downstream of summing point 118, amplifies signal D/a by a factor of 2a, and outputs signal −2D. Signal −2D combines with signal aS+D on first path 160 at a second summing point 124 (preferably without any signal loss), resulting in signal aS−D. In other words, error amplifier 120 is to have a gain such that the magnitude of phase-reversed distortion at the entry of summing point 124 is exactly twice that of the distortion from distortion generating amplifier 112. Accordingly, downstream of second summing point 124, only the distortion magnitude (+D) of signal aS+D on from path 160 is phase-shifted to −D by 180 degrees.

A second attenuator 126, which is connected downstream of second summing point 124, attenuates signal aS−D, resulting in signal S−D/a. A 4-way splitter 128, which is connected downstream of second attenuator 126, distributes signal S−D/a to four output amplifiers 130A to 130D. Each of output amplifiers 130A to 130D has the same amplification characteristics as does distortion generating amplifier 112. Thus, when output amplifiers 130A to 130D amplify signal S−D/a, distortion portion −D/a of signal S−D/a is amplified to −D, and this amplified (pre)distortion −D cancels a distortion D produced from output amplifiers 130A to 130D. Accordingly, output signal aS, which is amplified from input signal S by a times with no distortion, is output from each of output amplifiers 130A to 130D.

In summary, in the amplification circuit of FIG. 3, a distortion generating portion 102 generates a predistortion signal that is in theory identical (or in practice very similar) to the distortion signals generated by output amplifiers 130A to 130D, so that the distortion signals from output amplifiers 130A to 130D are completely canceled. Thus, there is no need for separate distortion generators for different orders of distortion signals. In addition, as illustrated in FIG. 3, multiple output amplifiers can be driven by a single predistortion circuit.

Figure 1A:
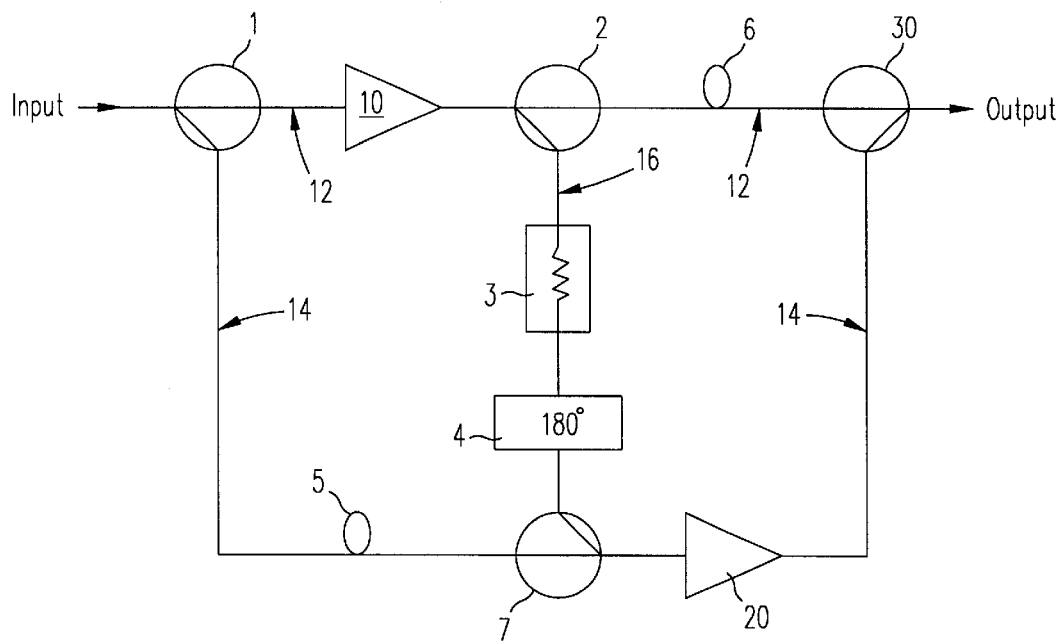
FIG. 1A is a block diagram of a conventional amplification circuit including a feedforward distortion cancellation circuit.
Figure 1B:
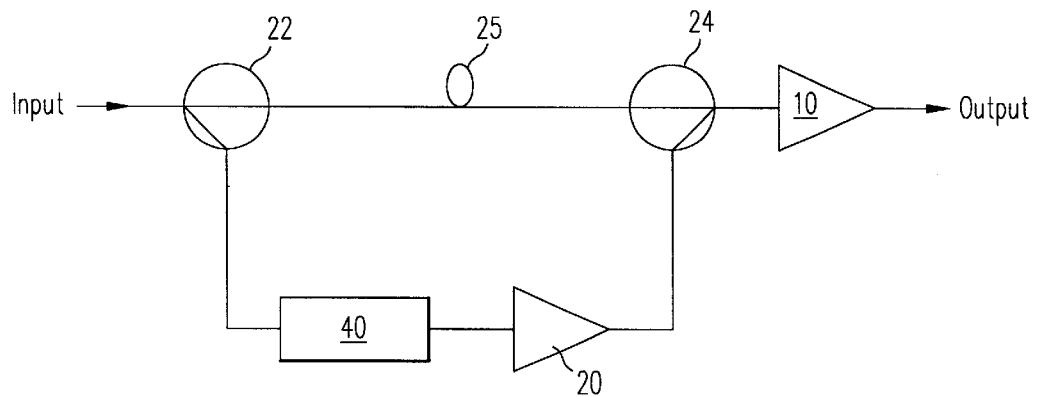
FIG. 1B is a block diagram of a conventional amplification circuit including a predistortion distortion cancellation circuit.
Figure 2:
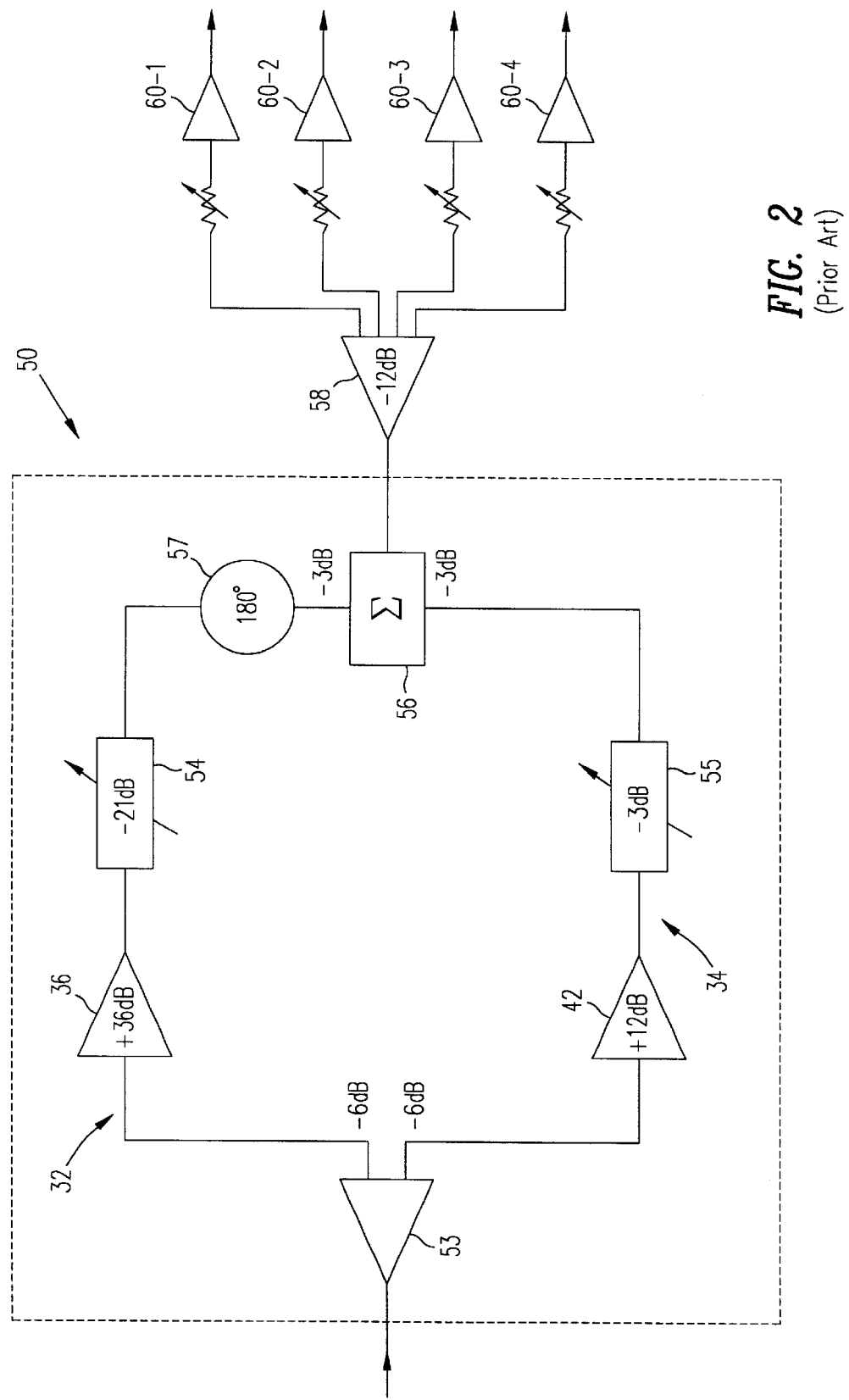
FIG. 2 is a block diagram of another conventional amplification circuit including a distortion cancellation circuit.

Unlike the prior art amplification circuit of FIG. 2, which must employ high gain output amplifiers for effective distortion cancellation, the amplification circuit of FIG. 3 does not require high gain output amplifiers. Output amplifiers 130A to 130D have lower gain than does error amplifier 120.

Figure 4:
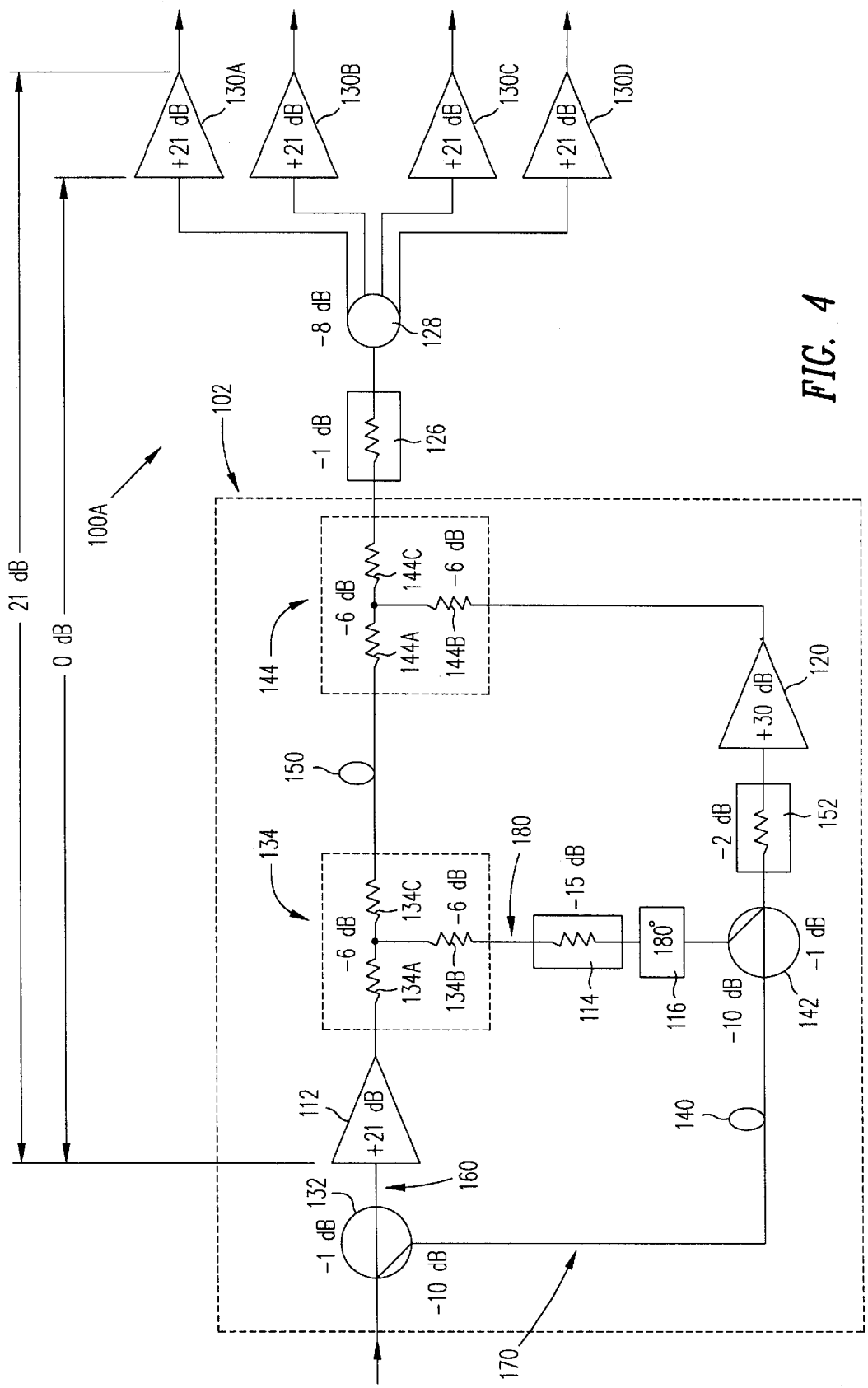
FIG. 4 is a block diagram of an embodiment of the amplification circuit of FIG. 4.

FIG. 4 illustrates an amplification circuit 100A which is an embodiment of the FIG. 3 amplification circuit 100 especially intended for broadband RF applications such as CATV video distribution.

Referring to FIG. 4, a first directional coupler 132 and a second directional coupler 142 are employed at nodes 110 and 118 of FIG. 3. (Such couplers are commercially available, e.g., as part no. EMDC-10-1-75 from M/A-COM in Lowell, Massachusetts. They are transformer-based.) First directional coupler 132 transfers 90% and 10% of input signal (fundamental signal) from a signal source (not shown) to paths 160 and 170, respectively, and prevents feedback from path 170 to path 160. Second directional coupler 142 combines the signals from paths 170 and 180, and also prevents the signal from path 180 from flowing back to first directional coupler 132. In this circuit, although a resistive splitter can be used instead of first directional coupler 132, first directional coupler 132 prevents a possible signal leakage from second directional coupler 142 from flowing into amplifier 112.

A resistive splitter 134 and a resistive combiner 144 are connected in FIG. 4 at nodes 122 and 124, respectively, of FIG. 3. Resistive splitter 134, which includes resistors 134A to 134C, splits the signal from amplifier 112 into paths 160 and 180. Resistive combiner 144, which includes resistors 144A to 144C, combines the signals from resistive splitter 134 and amplifier 120. The resistance values of resistors 134A to 134C and 144A to 144C are all 25 ohm.

A first delay line 140 and a second delay line 150 are respectively connected between directional coupler 132 and directional coupler 142 on path 170 and between resistive splitter 134 and resistive combiner 144 on path 160. Examples of delay lines 140 and 150 are lengths of coaxial cable or microstrip lines. The delays in delay lines 140 and 150 are 2.17 nanoseconds and 2.32 nanoseconds, respectively. In addition, an attenuator 152 is connected between directional coupler 142 and amplifier 120 in order to attenuate the signal from directional coupler 142.

The gains or attenuations at components of circuit 100A are shown in FIG. 4. (These values are exemplary.) The difference between the attenuation factor from the output terminal of amplifier 112 to the input terminal of resistive splitter 144 along path 160 and the attenuation factor from the output terminal of amplifier 112 to the input terminal of resistive splitter 144 along path 180 is controlled such that the magnitude of the distortion signal from amplifier 120 is, with opposite sign, twice the magnitude of the distortion signal from delay line 150. In FIG. 4, the attenuation factor (−6 dB) from the output terminal of amplifier 112 to the input terminal of resistive splitter 144 along path 160 is larger than the attenuation factor (−3 dB) from the output terminal of amplifier 112 to the input terminal of resistive splitter 144 along path 180 by 3 dB. However, this attenuation factor difference can be varied inclusively between 3 dB and 6 dB depending on the magnitude of signal loss in the circuit.

From the input terminal of distortion generating amplifier 112 to the output terminal of 4-way splitter 128, the total signal gain is zero as shown, and only predistortion is introduced to the signal so that the predistortion cancels the distortion generated from output amplifiers 130A to 130D. Accordingly, each of output amplifiers 130A to 130D outputs a signal amplified by +21 dB with no distortion.

In circuit 100A, the output power of distortion generating amplifier 112, which is a hybrid RF amplifier, is high, and thus the input power level of the predistortion at each of output amplifiers 130A to 130D is still high. Accordingly, the noise of output amplifiers 130A to 130D does not degrade the carrier-to-noise ratio performance of amplification circuit 100A.

Figure 5:
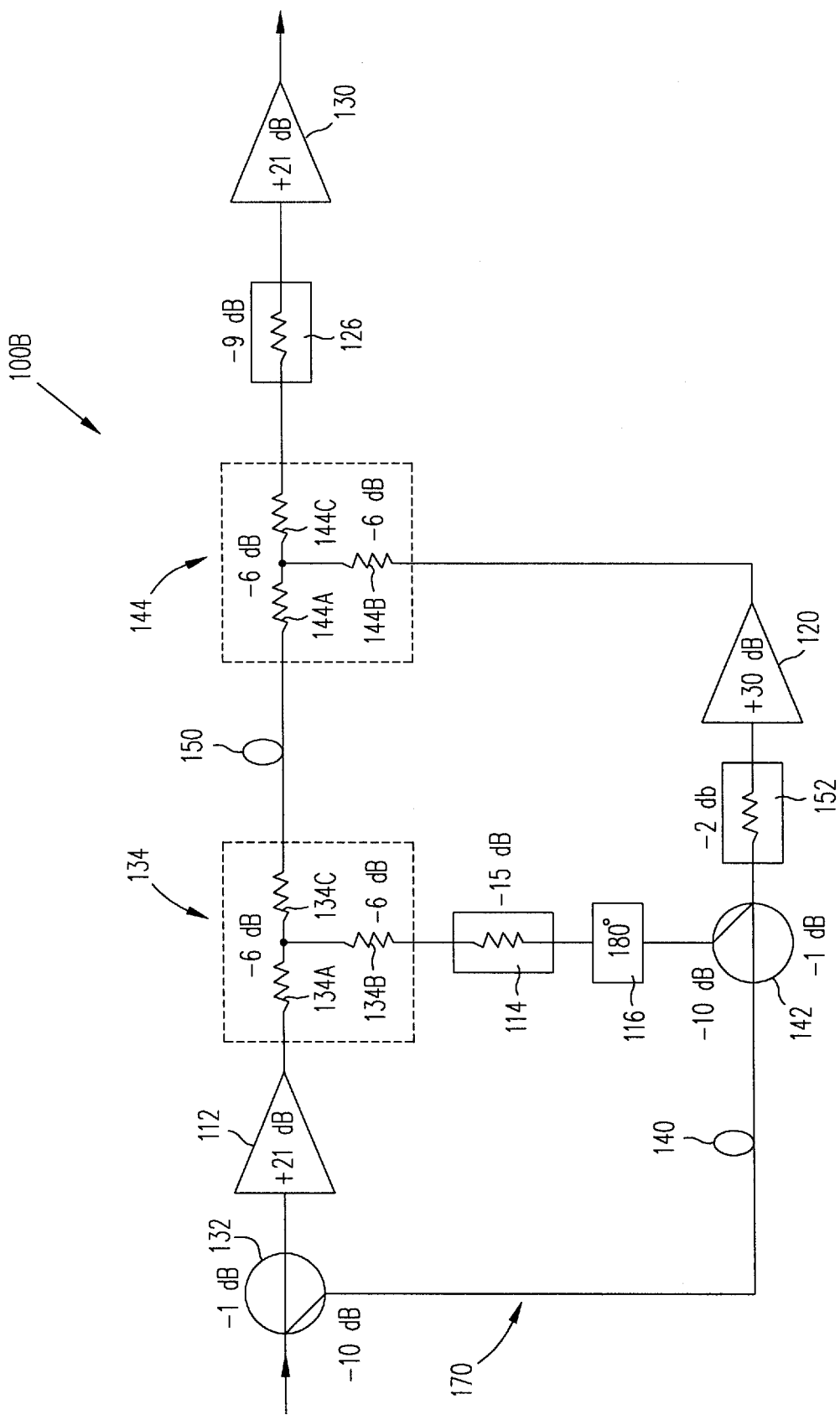
FIG. 5 is a block diagram of another embodiment of the amplification circuit of FIG. 4.

Although amplification circuit 100A includes four output amplifiers 130A to 130D, a similar circuit with a single output amplifier can be implemented. FIG. 5 shows such an amplification circuit 100B which is the same as circuit 100A of FIG. 4, but includes a single output amplifier 130. No 4-way splitter is required. Instead, a third attenuator 126 attenuates the signal by −9 dB upstream of output amplifier 130.

Figure 6:
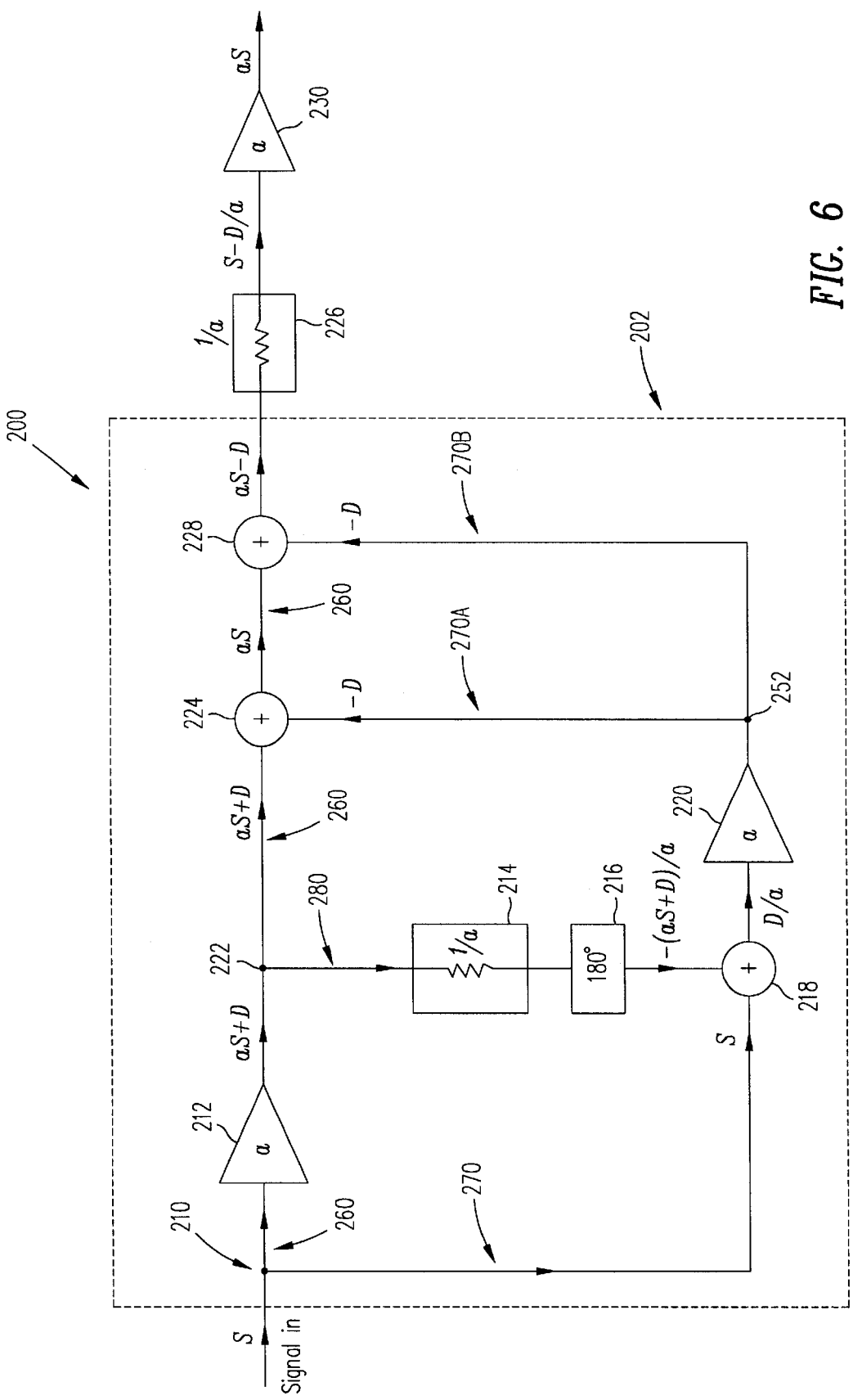
FIG. 6 is a block diagram of another amplification circuit including a distortion cancellation circuit in accordance with the present invention.

FIG. 6 shows another amplification circuit 200 including a distortion cancellation circuit in accordance with the present invention. In circuit 200, the distortion at the output terminal of an error amplifier is split into two parts. The first part cancels the distortion generated by a distortion generating amplifier (a true feedforward cancellation), and the second part cancels the distortion generated by an output amplifier. This approach allows independent control of the two cancellations when the distortion performances of the distortion generating and the output amplifiers are not identical to each other.

Amplification circuit 200 is similar to amplification circuit 100 of FIG. 3. Referring to FIG. 6, an input signal S from a signal source (not shown) splits at node 210 into a first path 260 and a second path 270. Connected in first path 260 is a distortion generating amplifier 212, which amplifies signal S input into distortion generating amplifier 212 and outputs signal aS+D. Then, signal aS+D splits at node 222 into first path 260 and a third path 280. Connected in third path 280 are a first attenuator 214 and a phase shifter 216. On third path 280, signal aS+D is attenuated by a factor of 1/a and phase-shifted by 180 degrees to produce signal −(aS+D)/a. Then, signal −(aS+D)/a combines with signal S on second path 270 at a first summing point 218 with no signal loss, canceling fundamental signal portion (−S) and resulting in signal −D/a. That is, only distortion portion (−D/a) of signal −(aS+D)/a remains.

An error amplifier 220 on second path 270 downstream of summing point 218 amplifies signal D/a by a factor of a, and outputs signal −D. Signal −D is split at a node 252 to a fourth path 270A and a fifth path 270B. Then, signal −D on path 270A combines with signal aS+D on first path 160 at a second summing point 224 without any signal loss, resulting in signal aS. Signal −D on path 270B combines with signal aS from second summing point 224 at a third summing point 228 with no signal loss, resulting in signal aS−D. In other words, the distortion signal (−D) on path 270A cancels the distortion signal generated from distortion generating amplifier 212, and the distortion signal(−D) on path 270B is a predistortion signal for canceling the distortion signal to be generated from an output amplifier 230. When the distortion signal from output amplifier 230 is different from the distortion signal from distortion generating amplifier 212, the distortion signal(−D) on path 270B can be modified by an attenuator, an amplifier, a magnitude equalizer, and/or a phase equalizer for effective distortion cancellation at output amplifier 230.

A second attenuator 226, which is downstream of third summing point 228, attenuates signal aS−D by a factor of 1/a, resulting in signal S−D/a. Then, output amplifier 130 amplifies signal S−D/a, such that distortion portion −D/a of signal S−D/a is amplified to −D, and this amplified predistortion signal −D cancels a distortion signal D from output amplifier 130. Accordingly, output signal aS, which is amplified from input signal S by a factor of a with no distortion, is output from output amplifier 130.

Figure 7:
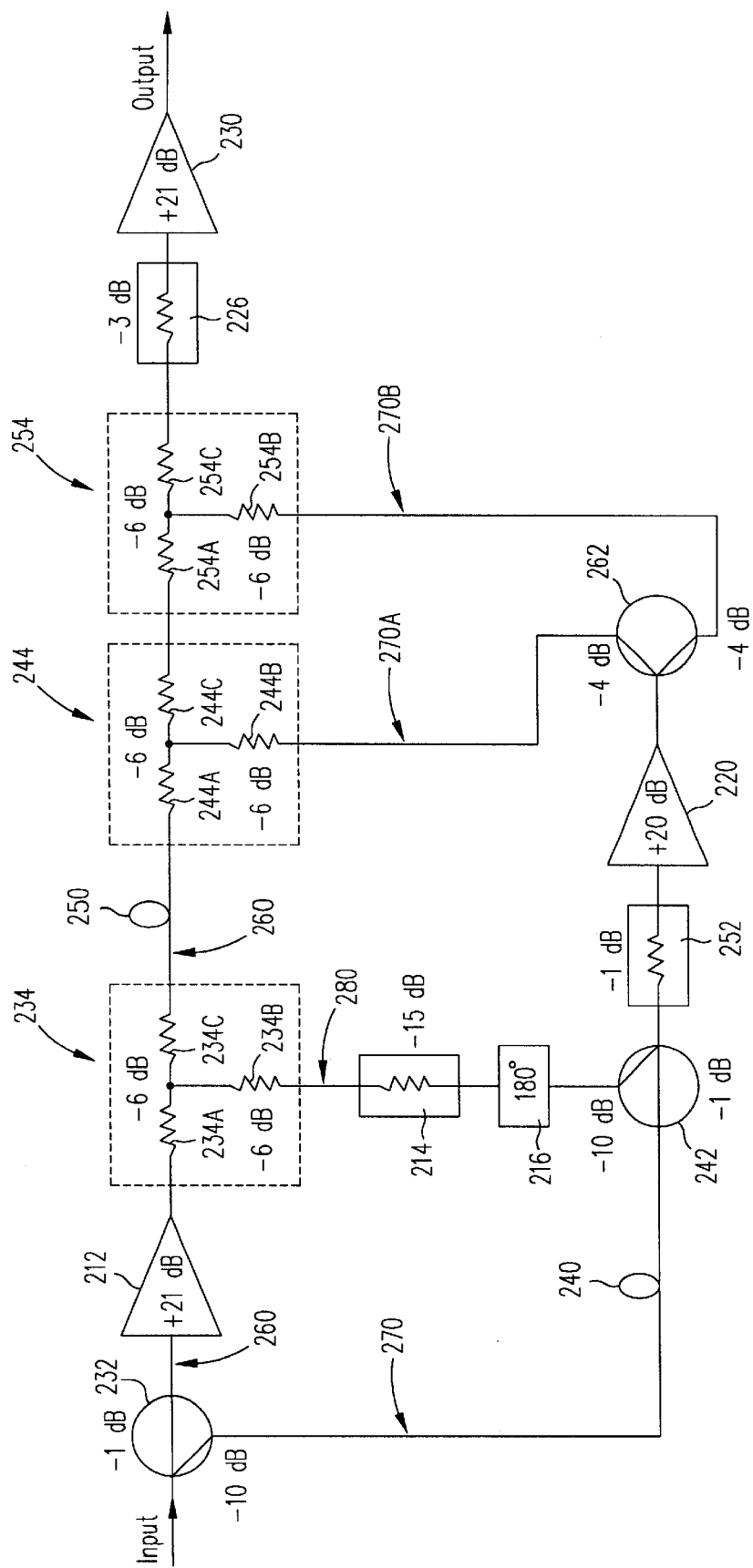
FIG. 7 is a block diagram of another embodiment of the amplification circuit of FIG. 6.

FIG. 7 illustrates an amplification circuit 200A which is an embodiment of amplification circuit 200 especially intended for broadband RF application.

Referring to FIG. 7, a first directional coupler 232 and a second directional coupler 242 are connected at nodes 210 and 218 of FIG. 6. The functions of directional couplers 232 and 242 are respectively identical to the functions of directional couplers 132 and 142 of FIG. 4.

A resistive splitter 234, a first resistive combiner 244, and a second resistive combiner 254 are connected at splitting and summing points 222, 224, and 226, respectively, of FIG. 6. Resistive splitter 234, which includes resistors 234A to 234C, splits the signal from amplifier 212 into paths 260 and 280. Resistive combiner 244, which includes resistors 244A to 244C, combines the signals from resistive splitter 234 and amplifier 220 on path 270A. Resistive combiner 254, which includes resistors 254A to 254C, combines the signals from resistive combiner 244 and amplifier 220 on path 270B.

A first delay line 240 and a second delay line 250 are respectively connected between directional coupler 232 and directional coupler 242 on path 270 and between resistive splitter 234 and resistive combiner 244 on path 260. Examples of delay lines 240 and 250 are a length of coaxial cable or microstrip line. The delays in delay lines 140 and 150 are 2.17 nanoseconds and 2.32 nanoseconds, respectively. In addition, an attenuator 252 is connected between directional coupler 242 and amplifier 220 in order to attenuate the signal from directional coupler 242. Although not shown in FIG. 7, additional attenuators, amplifiers, magnitude equalizers, and/or phase equalizers can be employed on paths 270A and 270B to adjust the magnitudes of the distortion signals on both paths 270A and 270B.

The gains or attenuations at components of circuit 200A are also shown in FIG. 7. The difference between the attenuation factor from the output terminal of amplifier 212 to the input terminal of resistive splitter 244 along path 260 and the attenuation factor from the output terminal of amplifier 212 to the input terminal of resistive splitter 244 along paths 280 and 270A is controlled such that the magnitude of the distortion signal from amplifier 220 is, with opposite sign, identical to the magnitude of the distortion signal from delay line 250. In FIG. 7, each of the attenuation factors from the output terminal of amplifier 212 to the input terminal of resistive splitter 244 along path 260 and from the output terminal of amplifier 212 to the input terminal of resistive splitter 244 along paths 280 and 270A is identically −6 dB.

From the input terminal of distortion generating amplifier 212 to the input terminal of output amplifier 230, the total signal gain is zero, and only predistortion is introduced to the signal so that the predistortion cancels the distortion generated from output amplifier 230. Accordingly, output amplifiers 230 outputs a signal amplified by +21 dB with no distortion.

Although the invention has been described with reference to particular embodiments, the description is only an example of the inventor's application and should not be taken as limiting. Various adaptations and combinations of features of the embodiments disclosed are within the scope of the invention as defined by the following claims.

I claim:

1. A circuit for amplifying an input signal, comprising:
   a first amplifier having an input terminal to which the input signal is applied, whereby the first amplifier produces a distortion at its output terminal;
   a first attenuator having a first terminal coupled to the output terminal of the first amplifier;
   a phase-shifter having its input terminal coupled to a second terminal of the first attenuator thereby phase-shifting a signal from the first attenuator;
   a first combiner coupled to combine the input signal and the phase-shifted signal;
   a second amplifier having its input terminal coupled to an output terminal of the first combiner;
   a second combiner having its input terminals coupled respectively to the output terminals of the second amplifier and the first amplifier;
   a second attenuator coupled to attenuate an output signal from the second combiner; and
   an output amplifier having its input terminal coupled to an output terminal of the second attenuator,
   wherein a signal gain from the input terminal of the first amplifier to the input terminal of the output amplifier is zero.

2. A circuit for amplifying an input signal, comprising:
a first amplifier having an input terminal to which the input signal is applied, whereby the first amplifier produces a distortion at its output terminal;
a first attenuator having a first terminal coupled to the output terminal of the first amplifier;
a phase-shifter having its input terminal coupled to a second terminal of the first attenuator thereby phase-shifting a signal from the first attenuator;
a first combiner coupled to combine the input signal and the phase-shifted signal;
a second amplifier having its input terminal coupled to an output terminal of the first combiner;
a second combiner having its input terminals coupled respectively to the output terminals of the second amplifier and the first amplifier;
a second attenuator coupled to attenuate an output signal from the second combiner;
an output amplifier having its input terminal coupled to an output terminal of the second attenuator;
a plurality of output amplifiers; and
a distributor coupled to distribute the signal output from the second attenuator to each of the plurality of output amplifiers.

3. The circuit of claim 2, further comprising:
a first delay element coupled between the input terminal of the first amplifier and the first combiner.

4. The circuit of claim 3, wherein the first delay element is a coaxial cable or a microstrip line.

5. The circuit of claim 2, further comprising:
a second delay element coupled between the output terminal of the first amplifier and the second attenuator.

6. The circuit of claim 5, wherein the second delay element is a coaxial cable or a microstrip line.

7. The circuit of claim 2, further comprising a splitter coupled to the input terminal of the first amplifier.

8. The circuit of claim 3, wherein the first combiner is a resistive splitter.

9. A circuit for amplifying an input signal, comprising:
a first amplifier having an input terminal to which the input signal is applied, whereby the first amplifier produces a distortion at its output terminal;
a first attenuator having a first terminal coupled to the output terminal of the first amplifier;
a phase-shifter having its input terminal coupled to a second terminal of the first attenuator thereby phase-shifting a signal from the first attenuator;
a first combiner coupled to combine the input signal and the phase-shifted signal;
a second amplifier having its input terminal coupled to an output terminal of the first combiner;
a second combiner having its input terminals coupled respectively to the output terminals of the second amplifier and the first amplifier;
a second attenuator coupled to attenuate an output signal from the second combiner; and
an output amplifier having its input terminal coupled to an output terminal of the second attenuator,
wherein the second amplifier has a gain factor twice that of the first amplifier, and the first and second attenuators each attenuate by the gain factor of the firs; amplifier.

10. A circuit for amplifying an input signal, comprising:
a first amplifier having an input terminal to which the input signal is applied, whereby the first amplifier produces a distortion at its output terminal;
a first attenuator having a first terminal coupled to the output terminal of the first amplifier;
a phase-shifter having its input terminal coupled to a second terminal of the first attenuator thereby phase-shifting a signal from the first attenuator;
a first combiner coupled to combine the input signal and the phase-shifted signal;
a second amplifier having its input terminal coupled to an output terminal of the first combiner;
a second combiner having its input terminals coupled respectively to the output terminals of the second amplifier and the first amplifier;
a second attenuator coupled to attenuate an output signal from the second combiner;
an output amplifier having its input terminal coupled to an output terminal of the second attenuator; and
a third combiner having its output terminal coupled to an input terminal of the second attenuator, and its input terminals coupled respectively to the output terminal of the second amplifier and the output terminal of the second combiner.

11. The circuit of claim 10, wherein a signal attenuation factor from the output terminal of the first amplifier to the input terminal of the second combiner is identical to a signal attenuation factor from the output terminal of the first amplifier to the input terminal of the second combiner through the second amplifier.

12. A circuit for amplifying an input signal, comprising:
a first amplifier having an input terminal to which the input signal is applied, whereby the first amplifier produces a distortion at its output terminal;
a first attenuator having a first terminal coupled to the output terminal of the first amplifier;
a phase-shifter having its input terminal coupled to a second terminal of the first attenuator thereby phase-shifting a signal from the first attenuator;
a first combiner coupled to combine the input sinal and the phase-shifted signal;
a second amplifier having its input terminal coupled to an output terminal of the first combiner;
a second combiner having its input terminals coupled respectively to the output terminals of the second amplifier and the first amplifier;
a second attenuator coupled to attenuate an output signal from the second combiner;
an output amplifier having its input terminal coupled to an output terminal of the second attenuator; and
a splitter coupled between the output terminal of the second amplifier and each of the second and third combiners.

13. A circuit for amplifying an input signal, comprising:
a first amplifier having an input terminal to which the input signal is applied, whereby the first amplifier produces a distortion at its output terminal;
a first attenuator having a first terminal coupled to the output terminal of the first amplifier;
a phase-shifter having its input terminal coupled to a second terminal of the first attenuator thereby phase-shifting a signal from the first attenuator;

a first combiner coupled to combine the input signal and the phase-shifted signal;

a second amplifier having its input terminal coupled to an output terminal of the first combiner;

a second combiner having its input terminals coupled respectively to the output terminals of the second amplifier and the first amplifier;

a second attenuator coupled to attenuate an output signal from the second combiner; and an output amplifier having its input terminal coupled to an output terminal of the second attenuator, wherein signal attenuation factors from the output terminal of the first amplifier to the input terminal of the second combiner and from the output terminal of the first amplifier to the input terminal of the second combiner through the second amplifier are such that downstream of the second combiner, a distortion signal from the node is changed to have an opposite sign with the same magnitude.

14. The circuit of claim 13, wherein the signal attenuation factor from the output terminal of the first amplifier to the input terminal of the second combiner is larger than the attenuation factor from the output terminal of the first amplifier to the input terminal of the second combiner through the second amplifier by 3 dB to 6 dB.

15. The circuit of claim 14, wherein the signal attenuation factor difference is 3 dB.

16. A method of amplifying an input signal, comprising the acts of:

amplifying a first portion of the input signal;

attenuating a portion of the amplified signal;

phase-shifting the attenuated signal;

combining the phase-shifted signal with a delayed remaining portion of the input signal;

amplifying the combined signal;

combining the amplified combined signal with a remaining portion of the amplified first portion of the input signal to form an output signal;

attenuating the output signal; and amplifying the attenuated output signal.

17. A method of amplifying an input signal, comprising the acts of:

amplifying at least a portion of the input signal by a first factor, wherein the amplified input signal includes a first distortion signal;

creating a predistortion signal;

combining the amplified input signal and the predistortion signal, wherein the combined signal has a second distortion signal that has an opposite sign to that of the first distortion signal;

attenuating the combined signal by the first factor; and amplifying the attenuated signal by the first factor.

18. The method of claim 17, wherein creating the predistortion signal comprises:

attenuating the amplified input signal by the first factor;

phase-shifting the attenuated amplified input signal;

combining the phase-shifted signal with a remaining portion of the input signal; and amplifying the combined signal by a second factor.

19. The method of claim 18, wherein the second factor has a value which is twice the first factor.

* * * * *